United States Patent
Van 'T Oever et al.

(10) Patent No.: US 9,748,136 B2
(45) Date of Patent: Aug. 29, 2017

(54) METHOD FOR FORMING AN ELECTRICALLY CONDUCTIVE VIA IN A SUBSTRATE

(71) Applicant: MICRONIT MICROFLUIDICS B.V., Enschede (NL)

(72) Inventors: Ronny Van 'T Oever, Epse (NL); Marko Theodoor Blom, Delden (NL); Jeroen Haneveld, Lochem (NL); Johannes Oonk, Enschede (NL); Peter Tijssen, Enschede (NL)

(73) Assignee: Micronit Microfluidics B.V. (NL)

( * ) Notice: Subject to any disclaimer, the term of this patent is extended or adjusted under 35 U.S.C. 154(b) by 0 days.

(21) Appl. No.: 14/440,814

(22) PCT Filed: Nov. 5, 2013

(86) PCT No.: PCT/NL2013/050787
§ 371 (c)(1),
(2) Date: May 5, 2015

(87) PCT Pub. No.: WO2014/070017
PCT Pub. Date: May 8, 2014

(65) Prior Publication Data
US 2015/0262874 A1    Sep. 17, 2015

(30) Foreign Application Priority Data
Nov. 5, 2012 (NL) ........................ 2009757

(51) Int. Cl.
*H01L 21/768* (2006.01)
*H01L 23/14* (2006.01)
(Continued)

(52) U.S. Cl.
CPC .... *H01L 21/76879* (2013.01); *B81C 1/00095* (2013.01); *H01L 21/486* (2013.01);
(Continued)

(58) Field of Classification Search
CPC ......... H01L 21/76879; H01L 23/49827; H01L 21/486
See application file for complete search history.

(56) References Cited

U.S. PATENT DOCUMENTS 5,511,428 A * 4/1996 Goldberg .............. B81B 7/0061
257/417
6,753,208 B1 * 6/2004 MacIntyre .......... H01L 23/3114
257/782

(Continued)

FOREIGN PATENT DOCUMENTS

EP         1431242 A2    6/2004
WO    2012011230 A1    1/2012

OTHER PUBLICATIONS

International Search Report mailed Apr. 15, 2014 (PCT/NL2013/050787); ISA/EP.

*Primary Examiner* — Michele Fan
(74) *Attorney, Agent, or Firm* — Banner & Witcoff, Ltd.

(57) ABSTRACT

A method for forming an electrically conductive via in a substrate that includes the steps of: forming a through hole in a first substrate; bringing a first surface of a second substrate into contact with the first surface of the first substrate, such that the through hole in the first substrate is covered by the first surface of the second substrate; filling the through hole in the first substrate with an electrically conductive material by electroplating to form the electrically conductive via, and removing the second substrate, wherein the first surface of the first and the second substrate each have a surface roughness $R_a$ of less than 2 nm, preferably less than 1 nm, more preferably less than 0.5 nm, and the first surface of the first and the second substrate are brought in direct contact with each other, such that a direct bond is formed there between.

12 Claims, 4 Drawing Sheets

(51) Int. Cl.
*H01L 23/498* (2006.01)
*H01L 21/48* (2006.01)
*H01L 21/683* (2006.01)
*B81C 1/00* (2006.01)

(52) U.S. Cl.
CPC ........ *H01L 21/6835* (2013.01); *H01L 23/147* (2013.01); *H01L 23/49827* (2013.01); *H01L 2221/68345* (2013.01); *H01L 2924/0002* (2013.01)

(56) References Cited

U.S. PATENT DOCUMENTS

| | | | |
|---|---|---|---|
| 2002/0092676 A1* | 7/2002 | Jimarez | H01L 21/4857 174/262 |
| 2002/0182771 A1 | 12/2002 | Akram | |
| 2004/0009649 A1 | 1/2004 | Kub et al. | |
| 2006/0166480 A1* | 7/2006 | Yun | B81C 1/00301 438/618 |
| 2008/0164573 A1 | 7/2008 | Basker et al. | |
| 2008/0290525 A1 | 11/2008 | Anderson et al. | |
| 2010/0068868 A1 | 3/2010 | Kim et al. | |
| 2010/0308455 A1 | 12/2010 | Kim et al. | |
| 2012/0021563 A1* | 1/2012 | Koyanagi | H01L 21/6835 438/107 |
| 2012/0091543 A1* | 4/2012 | Torashima | B81C 1/00158 257/415 |

* cited by examiner

FIG. 3A
FIG. 3B
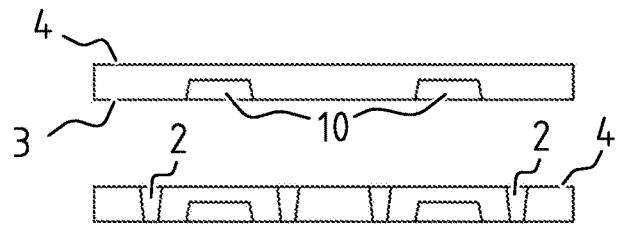
FIG. 3C
FIG. 3D
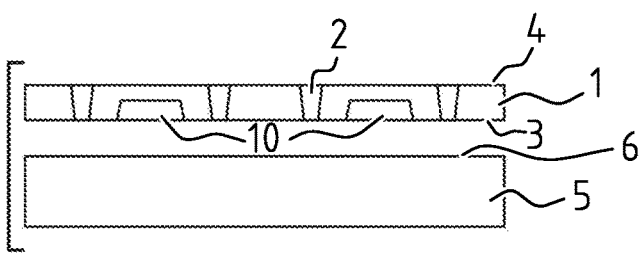
FIG. 3E
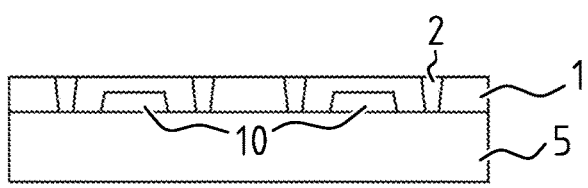
FIG. 3F
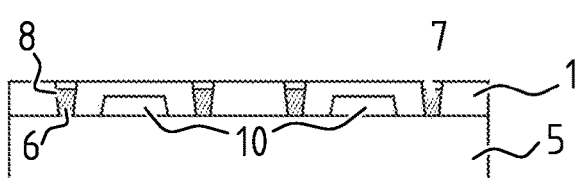
FIG. 3G
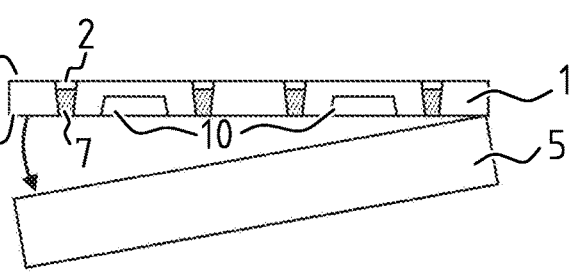
FIG. 3H
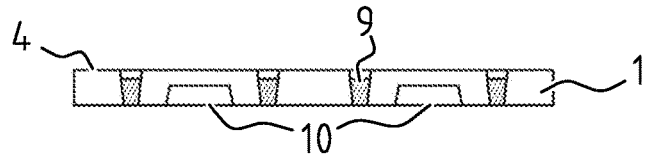

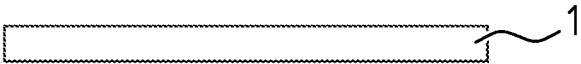
FIG. 4A
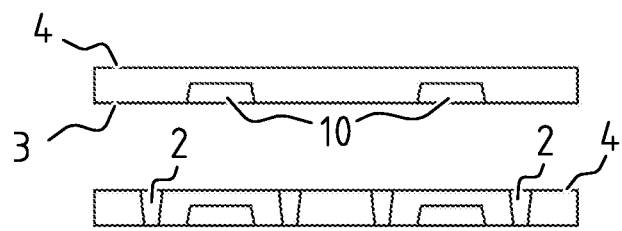
FIG. 4B
FIG. 4C
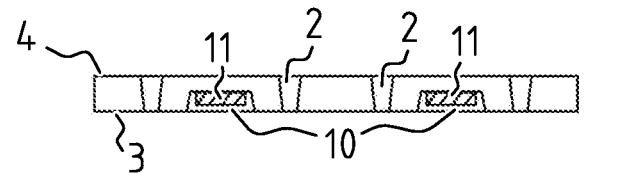
FIG. 4D
FIG. 4E
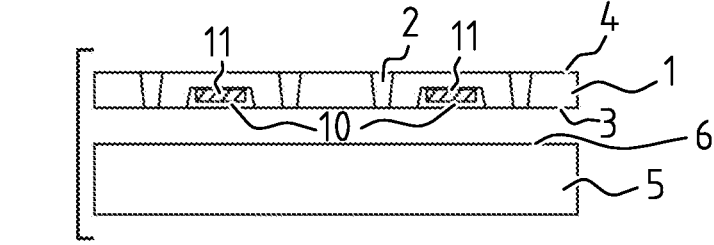
FIG. 4F
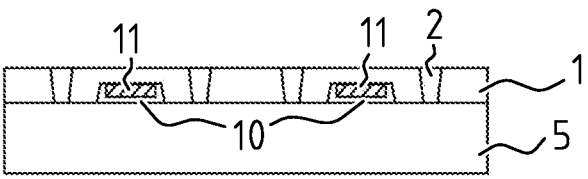
FIG. 4G
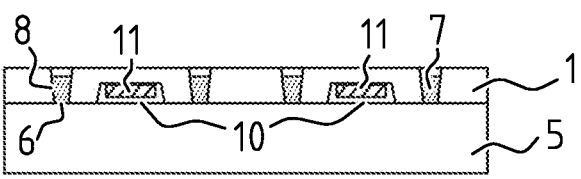
FIG. 4H
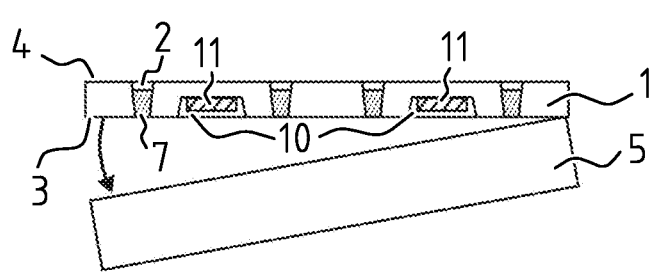
FIG. 4I
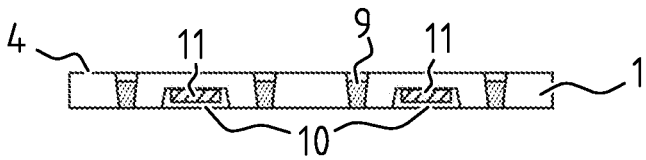

METHOD FOR FORMING AN ELECTRICALLY CONDUCTIVE VIA IN A SUBSTRATE

The present application is a U.S. National Phase Entry of International Application No. PCT/NL2013/050787 filed on Nov. 5, 2013, designating the United States of America and claiming priority to NL 2009757 filed on Nov. 5, 2012. The present application claims priority to and the benefit of the above-identified applications and the above-identified applications are incorporated by reference herein in their entirety.

The invention relates to a method for forming an electrically conductive via in a substrate, said method comprising the steps, to be performed in suitable sequence, of:
- a) providing a first substrate as said substrate;
- b) forming a through hole in said first substrate, said through hole extending between a first surface and a second surface of said first substrate;
- c) providing a second substrate;
- d) bringing a first surface of said second substrate into contact with said first surface of said first substrate, such that said through hole in said first substrate is covered by said first surface of said second substrate;
- e) filling said through hole in said first substrate with an electrically conductive material by means of electroplating for forming said electrically conductive via, wherein said electrically conductive material is deposited on said first surface of said second substrate, and
- f) removing said second substrate.

Such a method for forming an electrically conductive via in a substrate is known per se. In a known method said second substrate is provided with a metal seed layer on which the electrically conductive material is deposited and an adhesive layer provided on said seed layer for adhering the second substrate to said first substrate. In an area of the seed layer that is facing said through hole no adhesive layer is present, such that said seed layer forms a bottom of said through hole in said substrate and such that said electrically conductive material may be directly deposited on said seed layer. Due to the presence of the adhesive layer between the first substrate and the seed layer of the second substrate, a part of the electrically conductive material extends out of said through hole in the direction of the seed layer, said part having a length that is substantially equal to the thickness of said adhesive layer. After removing the second substrate having said seed layer and said adhesive layer, the first surface of said first substrate is polished in order to remove said extending part of electrically conductive material.

It is an object of the invention to improve said above described known method. In particular it is an object of the invention to improve or preferably eliminate said step of polishing said first surface of said first substrate.

This objective is achieved by a method of the type described in the preamble that is characterized in that said first surface of said substrate and said first surface of said second substrate each have a surface roughness $R_a$ of less than 2 nm, preferably less than 1 nm, more preferably less than 0.5 nm, and in that in step (d) said first surface of said first substrate and said first surface of said second substrate are brought in direct contact with each other, such that a direct bond is formed there between.

An advantage of said first and second substrate each comprising a first surface with a surface roughness $R_a$ of less than 2 nm, preferably less than 1 nm, more preferably less than 0.5 nm, is that such surfaces directly bond to each other by just bringing said first surfaces of said first and second substrate into contact with each other. As a result of said direct bond no adhesive layer is required for attaching said second substrate to said first substrate, such that said second substrate is in direct contact with said first substrate and no electrically conductive material extends out of said through hole beyond said first surface after filling said through hole. As such, polishing of the first surface of the first substrate in order to remove any extending part of electrically conductive material is no longer required.

The surface roughness is chosen such that a direct bond occurs between the first and second substrate. Said direct bond needs to be sufficiently strong for being able to perform the method according to the invention and/or sufficiently weak for being able to remove the second substrate from the first substrate after completing the method according to the invention.

It is noted that a plurality of through holes may be formed in said first substrate, wherein said second substrate covers said plurality of through holes.

It is further noted that depending on the type of filling of the through hole, i.e. partial or bumped, see also FIGS. 1E and 2E, it may be required to polish the second surface of the first surface.

It is further noted that according to the invention said second substrate functions as the electrode for electroplating.

In an embodiment of the method according to the invention said second substrate is made of silicon.

An advantage of this embodiment is that silicon has a very low surface roughness $R_a$, particularly less than 1 nm, more particularly less than 0.5 nm, such that a direct bond between the silicon second substrate and the first substrate is easily achieved. Silicon is a semiconductor and as such suitable for electroplating said electrically conductive material thereon in step (e) of the method according to the invention.

In another embodiment of the method according to the invention said second substrate is made of a metal, for example from Chromium (Cr), Copper (Cu), Zinc (Zn), Nickel (Ni), gold (Au), or steel. Such a metal will directly bond to said first substrate with its first surface if the first surface has a surface roughness $R_a$ of said of less than 2 nm, particularly less than 1 nm, more particularly less than 0.5 nm. In order to obtain such a low surface roughness said first surface of said second substrate may be polished prior to bringing the first surface into contact with said first substrate. For example, said polishing step may be performed by so called chemical mechanical polishing (CMP). In addition or alternatively, said first surface of said metal second substrate may be cleaned by suitable cleaning means.

Said first substrate may be made of any material that forms said above described direct bond with said second substrate.

For example, said first substrate may be made of glass or ceramic.

Alternatively, said first substrate may be made of silicon, wherein the method comprises step g), to be performed after step (b), of making the wall of said through hole electrically non-conductive.

The wall of said through hole must be electrically non-conductive in order to perform so called bottom up electroplating, wherein the electrically conductive material is deposited on the second substrate. Otherwise, said electrically conductive material may also attach to the wall of said through hole, which may lead to holes and/or cavities in said via.

Practically, step (g) is performed by oxidizing said wall of said through hole.

Optionally also the second surface of the first silicon substrate may be oxidized.

In an embodiment of the method according to the invention said second substrate is made of highly doped silicon.

For example, said highly doped silicon may have a resistance lying in the range of 0.01-0.02 Ω/cm.

Such a highly doped silicon substrate has been found suitable for depositing the electrically conductive material thereon via electroplating.

In an embodiment of the method according to the invention, said method comprises the step, to be performed after step (a) and before step (d), of:
h) forming a cavity in said first surface of said first substrate.

In methods where polishing of the first surface of the first substrate is required, the walls of any cavity are likely to be damaged, such that step (h) according to the invention cannot be performed. It is therefore the merit of the method according to the invention, in which the step of polishing said first surface of said first substrate is eliminated, that said method allows for said cavity being present and said step (h) to be performed.

In particular, said method according to the invention may comprise the step, to be performed after steps (a) and (h) and before step (d), of:
i) mounting a component in said cavity.

Polishing of a surface with a cavity and a component mounted in said cavity is even less desirable, because not only may the walls of said cavity be damaged, also said component may be damaged. As such the method according to the invention allows for said cavity with said component mounted therein.

For example, said component is an electrical, optical, mechanical or magnetic component.

The invention further relates to a substrate comprising an electrically conductive via, wherein the electrically conductive via is formed by the method as described above, said method comprising the steps, to be performed in suitable sequence, of:
a) providing a first substrate as said substrate;
b) forming a through hole in said first substrate, said through hole extending between a first surface and a second surface of said first substrate;
c) providing a second substrate;
d) bringing a first surface of said second substrate into contact with said first surface of said first substrate, such that said through hole in said first substrate is covered by said first surface of said second substrate;
e) filling said through hole in said first substrate with an electrically conductive material by means of electroplating for forming said electrically conductive via, wherein said electrically conductive material is deposited on said first surface of said second substrate, and
f) removing said second substrate,
wherein said first surface of said first substrate and said first surface of said second substrate each have a surface roughness $R_a$ of less than 2 nm, preferably less than 1 nm, more preferably less than 0.5 nm, and in that in step (d) said first surface of said first substrate and said first surface of said second substrate are brought in direct contact with each other, such that a direct bond is formed there between.

Such a substrate according to the invention may be easily and/or quickly made by performing the steps of the method according to the invention, preferably without the requirement to polish the first surface of the first substrate after removing said second substrate as described above.

The substrate or device produced by the method according the invention may be a so called microelectromechanical system (MEMS) device or a microfluidic device or chip.

As described above, said second substrate is for example made of silicon or a metal.

In an embodiment of the substrate according to the invention said substrate is made of glass or ceramic.

Glass and ceramic provide a direct bond with the second substrate with the first surface according to the invention, such that no adhesive layer is required to attach the second substrate to said substrate made of glass or ceramic.

In an alternative embodiment of the substrate according to the invention said substrate is made of silicon and the wall of said through hole is electrically non-conductive.

As a result of said wall being electrically non-conductive the electrically conductive material is deposited on the electrically conductive silicon second substrate during electroplating and not on the wall of the through hole.

For example the wall of said through hole is oxidized.

In an embodiment of the substrate according to the invention, said substrate comprises a cavity.

Optionally a component may be mounted in said cavity, said component being for example an electrical, optical, mechanical or magnetic component.

Said cavity and said component may be present as a result of said polishing step of the first surface of the substrate being eliminated.

The invention will now be explained in more detail with reference to figures illustrated in a drawing, wherein:

FIGS. 3A-3H show the steps of a third embodiment of the method according to the invention.
and
FIGS. 4A-4I show the steps of a fourth embodiment of the method according to the invention.

FIGS. 1A-1G, FIGS. 2A-2H, FIGS. 3A-3H and FIGS. 4A-4I show the steps of the method for forming an electrically conductive via in a substrate according to the invention. Corresponding features are denoted by corresponding reference numerals.

Figure 1A:
FIGS. 1A-1G show the steps of a first embodiment of the method according to the invention.
Figure 2A:
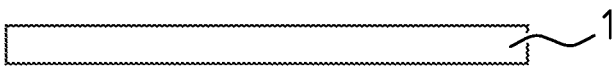
FIGS. 2A-2H show the steps of a second embodiment of the method according to the invention.

In the first step, as shown in FIGS. 1A, and 2A, a first substrate 1 is provided. Said first substrate 1 comprises a first surface 3 having a surface roughness $R_a$ of less than 2 nm, preferably less than 1 nm, more preferably less than 0.5 nm. Said first substrate 1 may for example be made of glass, ceramic or silicon.

Figure 1B:
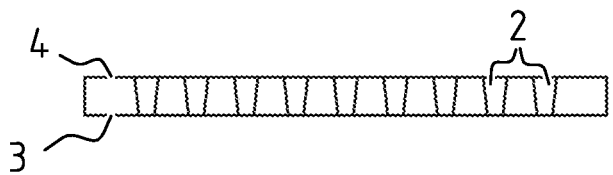
Figure 2B:
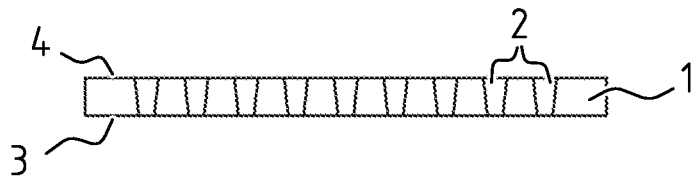

In the second step, which is shown in FIGS. 1B and 2B, a plurality of through holes 2 are formed in said first substrate 1, for example by means of powder blasting or etching. The through holes 2 extend between a first surface 3 and a second surface 4 of said first substrate 1.

Figure 1C:
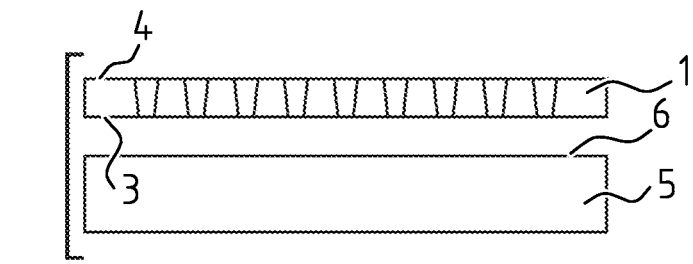
Figure 2C:
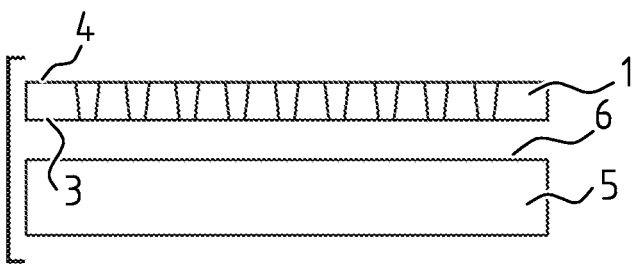

FIGS. 1C and 2C show a third step of the method, wherein a second substrate 5 is provided. Said second substrate 5 may be made of any (semi)conductive material with a first surface 6 having a surface roughness $R_a$ of less than 2 nm, preferably less than 1 nm, more preferably less than 0.5 nm. For example, said second substrate 5 may be made of a metal. Alternatively, said second substrate 5 is made of silicon, preferably highly doped silicon having a resistance lying in the range of 0.01-0.02 Ω/cm. Such a silicon second substrate 5 is electrically conductive such that it is suitable for electroplating an electrically conductive material thereon. As such, no seed layer is required.

Said second substrate 5 comprises a first surface 6 which is brought into direct contact (so without any intermediate layer, such as an adhesive layer) with said first surface 3 of said first substrate 1 by moving the second substrate 5 and the first substrate 1 in the direction of each other in a fourth step of the method. By bringing the first surfaces 3, 6 of respectively the first and second substrate 1, 5 into contact a direct bond between the two substrates 1, 5 is provided, see also FIGS. 1D and 2D. As a result of the direct bond between the two substrates 1, 5 no adhesive layer is required for attaching the two substrates 1, 5 to each other.

Optionally the first surface 3 of the first substrate 1 and/or the first surface 6 of the second substrate 5 may be polished and/or cleaned prior to bringing them into contact with each other in order to increase the bonding strength between the two substrates 1, 5. Such polishing and surface cleaning is known per se and suitable conventional polishing and cleaning means may be used.

Figure 1D:
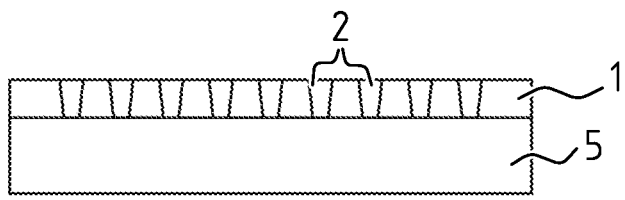
Figure 2D:
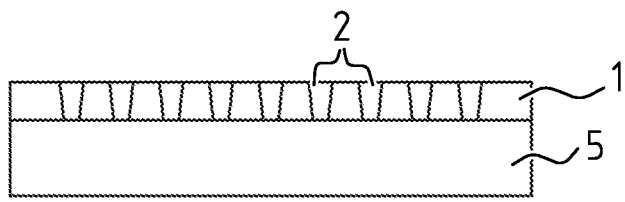

As is shown in FIGS. 1D and 2D, the through holes 2 in said first substrate 1 are covered by said first surface 6 of said second substrate 5.

Figure 1E:
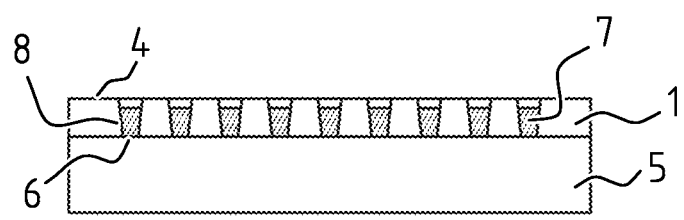
Figure 2E:
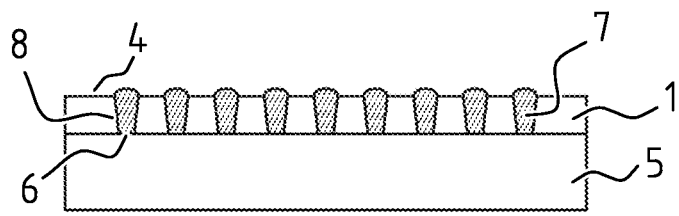

In a fifth step, which is shown in FIGS. 1E and 2E, the through holes 2 in said first substrate 1 are filled with an electrically conductive material 7 by means of electroplating, wherein said electrically conductive material 7 is deposited on said first surface 6 of said second substrate 5. Said electrically conductive material 7 may be any metal that is suitable for forming a conductive via. For example, the material 7 may be chosen from the group comprising Copper (Cu), gold (Au) and Nickel (Ni). In order to deposit the material 7 on the electrically conductive second substrate 5 and not on the walls 8 of the through holes 2, the walls 8 must be electrically non-conductive. For example, glass and ceramic are electrically non-conductive materials, such that also the walls 8 of the through holes 2 of a glass or ceramic substrate 1 are non-conductive. In case of a first substrate 1, the walls 8 may for example be made electrically non-conductive by oxidizing the walls 8. Alternatively, a layer of a non-conductive material may be provided on the walls 8 (not shown).

FIGS. 1E and 2E show two different types of filling the through holes 2, i.e. partial (FIG. 1E) and bumped (FIG. 2E). With partial filling the through holes 2 are filled with material 7 up to below the second surface 4 of the first substrate 1, such that the material 7 does not extend out of said through holes 2 beyond the second surface 4. With bumped filling the through holes 2 are filled with material 7 up to above the second surface 4 of the first substrate 1, such that the material 7 does extend out of said through holes 2 beyond the second surface 4, thereby forming little bumps on the surface 4.

Figure 1F:
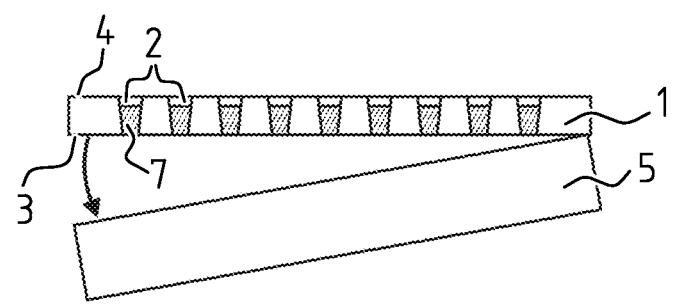
Figure 2F:
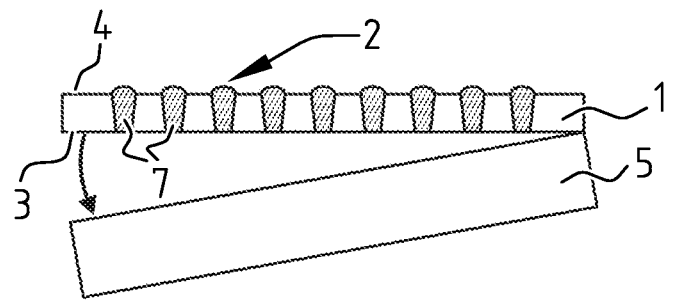

In a sixth step, see FIGS. 1F and 2F, the second substrate 5 is removed from the first substrate 1. As is clear from this figure, because of the direct bond between the two substrates 1, 5 and the absence of any adhesive layer, the material 7 does not extend out of the through holes 2 beyond the first surface 3. Removing of the second substrate 5 may take place relatively easy, because the process and material 7 are chosen such that the material 7 does not strongly attach to the second substrate 5.

Figure 1G:
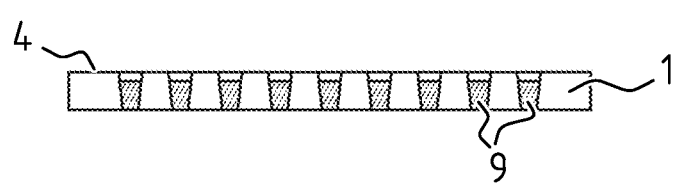

After removing the second substrate 5, the substrate 1 having electrically conductive vias 9 that is manufactured by means of the method according to FIGS. 1A-1F is finished, see FIG. 1G. It is not required to polish any of the surfaces 3, 4, because the material 7 does not extend out of the through holes 2 beyond any of the surfaces 3, 4.

Figure 2G:
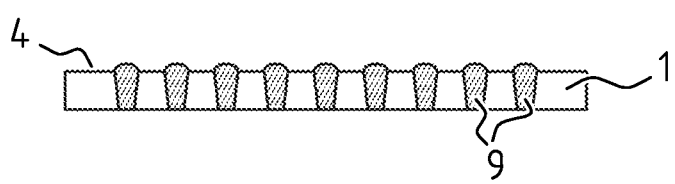
Figure 2H:
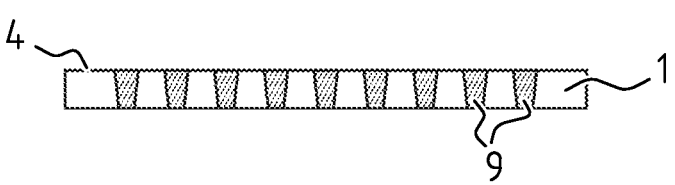

The substrate 1 having electrically conductive vias 9 that is manufactured by means of the method according to FIGS. 2A-2F may not yet be finished after removing the second substrate 5. Due to said described bumped filling of the through holes 2, the material 7 extends beyond the second surface 4, see FIG. 2G, such that polishing of the second surface 4 may be required. After polishing the second surface 4 is flat, see FIG. 2H. In accordance with the invention the first surfaced 3 does not need to be polished. Alternatively the bumps on the surface 4 may remain thereon, such that the substrate 1 of FIG. 2G may be the finished substrate.

After removing the second substrate 5, the second substrate 5 may be reused for manufacturing another substrate 1. As such the method according to the invention is cost effective because the second substrate 5 may be reused and does not need to be thrown away after a single use. Also, because no seed layer is required it is not required to provide a new seed layer on the second substrate after use in the method for forming a via in a substrate, as may be the case with the conventional method as described above.

The method according to FIGS. 3A-3H and FIGS. 4A-4I are similar to the method according to FIGS. 1A-1G. In particular, the step of FIGS. 3A and 4A is equal to the step of FIG. 1A, the step of FIGS. 3C and 4C is equal to the step of FIG. 1B, and the steps of FIGS. 3D-3H and 4E-4I are equal to the steps of FIGS. 1C-1G. For a description of the steps of FIGS. 3A, 3C, 3D-3H, 4A, 4C, 4E-4I the reader is referred to the description of FIGS. 1A-1G. The method according to FIGS. 3A-3H further comprises one additional step as shown in FIG. 3B, and the method according to FIGS. 4A-4I further comprises two additional steps as shown in FIGS. 4B and 4D, wherein the steps of FIGS. 3B and 4B are the same steps.

In the step of FIGS. 3B and 4B two cavities 10 are formed in the first surface 3 of the first substrate 1. For example, said cavities 10 may be formed by means of powder blasting or etching. It is noted that any number of cavities 10 may be provided. The step of FIGS. 3B and 4B is performed after the first step of providing the first substrate as shown in FIGS. 3A and 4A. The step of FIGS. 3B and 4B is performed before, simultaneously with, or after the second step of forming the through holes 2 as shown in FIGS. 3C and 4C, wherein in this example the step of FIGS. 3B and 4B is performed before the second step as shown in FIGS. 3C and 4C.

The method according to the invention, in which the step of polishing said first surface of said first substrate is eliminated, allows for the cavities 10 being present in the first surface.

In the step of FIG. 4D two components 11 are mounted in the two cavities 10. Said components 11 may be electrical, optical, mechanical and/or magnetic components. The step of FIG. 4D is performed before the step of bringing the first surfaces 3, 6 of respectively the first and second substrate 1, 5 in to contact, as shown in FIGS. 4E and 4F. The step of FIG. 4D is preferably performed after the step of forming the through holes 2 as shown in FIG. 4C, such that the components cannot be damaged during the step of forming the through holes 2. It is clear that the step of FIG. 4D is performed after forming the cavities 10 of FIG. 4B.

The method according to the invention, in which the step of polishing said first surface of said first substrate is eliminated, allows for the components 11 being present in the cavities 10 in the first surface.

The invention is not restricted to the variants shown in the drawing, but it also extends to other preferred embodiments that fall within the scope of the appended claims.

The invention claimed is:

1. Method for forming an electrically conductive via in a substrate, said method comprising the steps of:
   a) providing a first substrate as said substrate;
   b) forming a through hole in said first substrate, said through hole extending between a first surface and a second surface of said first substrate;
   c) providing a second substrate;
   d) bringing a first surface of said second substrate into contact with said first surface of said first substrate, such that said through hole in said first substrate is covered by said first surface of said second substrate;
   e) filling said through hole in said first substrate with an electrically conductive material by means of electroplating to form said electrically conductive via, wherein said electrically conductive material is deposited on said first surface of said second substrate, and
   f) removing said second substrate including said first surface of said second substrate on which said electrically conductive material is deposited,
   wherein said first surface of said first substrate and said first surface of said second substrate each have a surface roughness Ra of less than 2 nm, and in that in step (d) said first surface of said first substrate and said first surface of said second substrate are brought in direct contact with each other, such that a direct bond is formed there between.

2. Method according to claim 1, wherein said second substrate is made of silicon or a metal.

3. Method according to claim 1, wherein said first substrate is made of glass or ceramic.

4. Method according to claim 1, wherein said first substrate is made of silicon, and wherein the method comprises step g), to be performed after step (b), of making the wall of said through hole electrically non-conductive.

5. Method according to claim 4, wherein step (g) is performed by oxidizing said wall.

6. Method according to claim 1, wherein said second substrate is made of highly doped silicon.

7. Method according to claim 6, wherein said highly doped silicon has a resistance lying in the range of 0.01-0.02 Ω/cm.

8. Method according to claim 1, wherein the method comprises the step, to be performed after step (a) and before step (d), of:
   h) forming a cavity in said first surface of said first substrate.

9. Method according to claim 8, wherein the method comprises the step, to be performed after steps (a) and (h) and before step (d), of:
   i) mounting a component in said cavity.

10. Method according to claim 9, wherein said component is an electrical, optical, mechanical or magnetic component.

11. Method according to claim 1, wherein said first surface of said first substrate and said first surface of said second substrate each have a surface roughness Ra of less than 1 nm.

12. Method according to claim 1, wherein said first surface of said first substrate and said first surface of said second substrate each have a surface roughness Ra of less than 0.5 nm.

* * * * *